United States Patent [19]

Tsukazaki et al.

[11] Patent Number: 5,525,158
[45] Date of Patent: Jun. 11, 1996

[54] THIN FILM DEPOSITION APPARATUS

[75] Inventors: Hisashi Tsukazaki; Goro Oakamoto; Yuki Ito; Kenichiro Yamanishi; Hiroki Ito; Masahiro Hanai; Hiroyuki Ishii, all of Hyogo, Japan

[73] Assignee: Mitsubishi Denki Kabushiki Kaisha, Chiyoda-Ku, Japan

[21] Appl. No.: 128,228

[22] Filed: Sep. 29, 1993

[30]     Foreign Application Priority Data

Oct. 26, 1992  [JP]  Japan .................................... 4-287452
Mar. 22, 1993  [JP]  Japan .................................... 5-061840

[51] Int. Cl.⁶ ......................... C23C 16/00; C23C 14/46; C23C 14/34
[52] U.S. Cl. ............... 118/723 CB; 118/723 VE; 118/723 MP; 118/723 FI; 204/298.04; 204/298.26; 204/298.28; 204/192.3; 204/192.11; 204/192.12
[58] Field of Search ............... 118/723 CB, 723 MP, 118/723 FE, 723 FI, 723 VE, 723 R; 204/298.04, 298.05, 298.07, 298.09, 298.26, 298.28, 192.12, 192.17, 192.3, 192.11; 427/523, 524, 531, 592, 593, 250

[56]          References Cited

U.S. PATENT DOCUMENTS

| | | | |
|---|---|---|---|
| 4,147,573 | 4/1979 | Morimoto | 204/298.05 |
| 4,197,814 | 4/1980 | Takagi et al. | 204/298.05 |
| 4,336,277 | 6/1982 | Bunshah et al. | 118/723 VE |
| 4,624,859 | 11/1986 | Akira et al. | 427/527 |
| 4,717,462 | 5/1988 | Homma et al. | 204/298.06 |
| 4,724,060 | 2/1988 | Sakata et al. | 204/298.11 |
| 4,756,810 | 7/1988 | Lamont, Jr. et al. | 204/298.09 |
| 4,805,555 | 2/1989 | Itoh | 204/298.05 |
| 4,811,690 | 3/1989 | Kawagoe et al. | 118/723 CB |
| 4,915,806 | 4/1990 | Lardon et al. | 427/524 |
| 4,944,961 | 7/1990 | Lu et al. | 427/531 |
| 5,080,455 | 1/1992 | King et al. | 204/298.04 |
| 5,114,556 | 5/1992 | Lamont, Jr. | 204/192.12 |

FOREIGN PATENT DOCUMENTS

| | | |
|---|---|---|
| 3839903 | 6/1989 | Germany . |
| 4027896 | 3/1991 | Germany . |
| 60-255972 | 12/1985 | Japan . |
| 1-212761 | 8/1989 | Japan .............................. 118/723 CB |
| 2-271634 | 11/1990 | Japan . |

OTHER PUBLICATIONS

Patent Abstracts of Japan, C–346, vol. 10, No. 131, May 15, 1986, (60–255972).
Patent Abstracts of Japan, C–395, vol. 11, No. 3, Jan. 7, 1987, (60–179863), (61–183467).
Patent Abstracts of Japan, C–449, vol. 11, No. 300, Sep. 29, 1987, (62–93368).
Patent Abstracts of Japan, C–528, vol. 12, No. 344, Sep. 16, 1988, (63–103065).
Patent Abstracts of Japan, C–544, vol. 12, No. 438, Nov. 17, 1988, (63–162862).
Patent Abstracts of Japan, C–592, vol. 13, No. 187, May 2, 1989, (1–11965).

(List continued on next page.)

Primary Examiner—R. Bruce Breneman
Assistant Examiner—Rodney G. McDonald
Attorney, Agent, or Firm—Burns, Doane, Swecker & Mathis

[57]          ABSTRACT

A thin film deposition apparatus for use in a semiconductor manufacturing process or the like, is provided to, in particular, deposit a diffusion barrier thin film onto a substrate having a concave portion with a relatively high aspect ratio (hereinafter referred to as a contact hole). In the thin film deposition apparatus, a small surface and point source or a ring-shaped source is employed, evaporation is performed under such a condition that the Knudsen number $K_n=\lambda/H$ (a ratio of a mean free path $\lambda$ of an evaporation material particle to a distance (H) between the evaporation source and the substrate) becomes 0.1 or more, and a relation of the substrate and the evaporation source is set according to the aspect ratio of the contact hole, resulting in deposition of the thin film with good coverage on a bottom surface of the contact hole.

13 Claims, 14 Drawing Sheets

OTHER PUBLICATIONS

*Patent Abstracts of Japan*, C–734, vol. 14, No. 304, Jun. 29, 1990, (2–101159).

*Patent Abstracts of Japan*, C–771, vol. 14, No. 480, Oct. 19, 1990, (2–197566).

*Patent Abstracts of Japan*, C–944, vol. 16, No. 228, May 27, 1992, (4–45264).

*Patent Abstracts of Japan*, C–990, vol. 16, No. 470, Sep. 30, 1992, (4–168272).

*Patent Abstracts of Japan*, C–993, vol. 16, No. 485, Oct. 8, 1992, (4–176863).

*Patent Abstracts of Japan*, C–997, vol. 16, No. 509, Oct. 21, 1992, (4–187760).

EVAPORATION SOURCE-SUBSTRATE DISTANCE(H) : 700(mm)

SUBSTRATE CENTER AXIS-EVAPORATION SOURCE
ECCENTRIC DISTANCE(L) : 120(mm)

ASPECT RATIO(AR) : 2.8

RADIUS OF SUBSTRATE(R) : 100(mm)

FIG. 11 (B) (PRIOR ART)

THIN FILM DEPOSITION APPARATUS

BACKGROUND OF THE INVENTION

1. Field of the Invention

The present invention relates to a thin film deposition apparatus for use in a semiconductor manufacturing process or the like, and in particular to improvement of coverage to a bottom surface and a side surface of a fine groove or a pore when a thin film, such as a diffusion barrier film is deposited onto a substrate having the fine groove or the pore (hereinafter referred to as the contact hole) with a higher aspect ratio.

2. Description of the Prior Art

In semiconductor devices such as LSI, an evaporated film tends to have a finer structure because of highly integrated devices. As a result, there has been an increase in the use of relatively deep holes or through-holes. Such holes have an aspect ratio (AR=ration of hole depth to hole diameter) of 1 or more FIG. 1 is a sectional view showing a structure of a thin film deposition apparatus using a conventional sputtering method, disclosed in, for example, Japanese Patent Application Laid-Open No. 4-64222. In FIG. 1, reference numeral 1 indicates a vacuum tank, and 2 indicates an exhaust passage extending from a bottom portion of the vacuum tank 1. The exhaust passage 2 is connected to a high-evacuation pump (not shown). Further, reference numeral 3 indicates an evaporation material made of, for example, high purity titanium (Ti) when a diffusion barrier film is deposited, or high purity aluminum (Al), or an alloy essentially containing aluminum, when an interconnecting film is deposited. The evaporation material 3 is supported by a holder 5 which is disposed in the vacuum tank 1 through an insulating support member 4. Reference numeral 6 indicates a substrate mounted on a substrate holder 8 including a heater 7. The substrate 6 should be chosen such that the evaporation material 3 is larger than the substrate 6 in dimension. For example, an evaporation material 3 having a diameter in an approximate range of 250 to 300 mm is employed when a substrate 6 having a diameter of 200 mm is employed.

Reference number 9 indicates a sputtering power source connected to the holder 5, and 10 indicates a glow discharge forming between the evaporation material 3 and the substrate 6. The discharge is maintained by a high purity argon (Ar) gas which is introduced through a gas introducing valve 11. When titanium nitride (TiN) is deposited as the diffusion barrier film, a mixed gas of the high purity argon gas and high purity nitrogen is introduced. Reference numeral 12 indicates a shield which limits a generating position of the glow discharge 10, and prevents abnormal discharge to the vacuum tank 1 or the like.

A description will now be given of the thin film deposition method using the conventional apparatus constructed as set forth above. The substrate 6 onto which the thin film is deposited is mounted onto the substrate holder 8, and the vacuum tank 1 is evacuated, by using the high-evacuation pump, to a pressure level of $10^{-4}$ Pa. Subsequently, the high purity argon gas is introduced by adjusting the gas introducing valve 11 until the pressure in the vacuum tank 1 becomes 0.1 Pa. Then, the sputtering power source 9 is actuated to generate the glow discharge between the evaporation material 3 and the substrate 6. Accordingly, an argon ion in a discharge space sputters the evaporation material 3, turning out particles 3a of the evaporation material 3. Thus, these particles 3a of the evaporation material 3 are deposited on the substrate 6 to form the thin film. In such a sputtering method, a distance between the evaporation material 3 and the substrate 6 is about 10 cm, pressure at a time of thin film deposition is about 0.6 Pa, and a mean free path ($\lambda$) of the evaporation material particles 3a is about 1 cm. Therefore, it is possible to find that the Knudsen number $K_n=\lambda/H$ is 0.1 depending upon a ratio of the mean free path $\lambda$ of the interconnecting material particles 3a to the distance H between the evaporation material 3 and the substrate 6. The evaporation material particles 3a ejected from the evaporation material 3 can reach the substrate 6 while being scattered by a discharging gas or a residual gas.

A description will now be given of a method of depositing a multilayer interconnection film into the contact hole by using the sputtering method as set forth above with reference to FIGS. 2(A) to 2(D). In FIG. 2(A), reference numeral 6 indicates a substrate made of silicon or the like, 12 indicates a diffusion layer, 13 is an insulating film made of silicon dioxide ($SiO_2$) having a thickness of 1 μm by using, for example, a CVD method, and a contact hole 13a is provided in the insulating film 13 having a diameter of about 0.6 μm, a depth of 1 μm, and an aspect ratio of 1.7. In the first step, the high purity titanium is employed as the evaporation material 3 to deposit a diffusion barrier film 14 of the titanium nitride according to a reactive sputtering method to sputter the evaporation material 3 using a discharge gas in which the argon and the nitrogen are mixed in a ratio of 1:1 as shown in FIG. 2(B). In a second step, an aluminium-silicon-copper alloy is employed as the evaporation material 3, and the argon serving as the discharge gas is introduced into the vacuum tank 1 and a substrate temperature is set to room temperature to sputter the evaporation material 3 so as to form a first interconnecting film 15 as shown in FIG. 2(C). Further, in a third step, the evaporation material 3 made of an aluminium alloy is sputtered while the substrate is rapidly heated up to the substrate temperature of 500° C., resulting in a second interconnecting film 16 formed by plugging up the contact hole 13a with the interconnecting material as shown in FIG. 2(D).

In the sputtering method as set forth above, the particles of the evaporation material collide with the discharge gas, resulting in low directivity of the particles. It is known that an incident angle distribution of the evaporation material particles on the substrate is determined by the cosine law. That is, in the sputtering method, many particles are diagonally incident on the substrate, and a few particles can reach a bottom portion of the contact hole. Further, it is difficult to deposit the diffusion barrier film or the interconnecting film with good coverage in an contact hole having the aspect ratio of 2 or more. When an evaporation method is employed as in the case of an interconnecting film deposition apparatus disclosed in, for example, Japanese Patent Application Laid-Open No. 2-271634, it is generally considered that the evaporation method can exhibit good directivity of the particles of the interconnecting material. However, it is difficult to deposit the diffusion barrier film or the interconnecting film onto a bottom surface of the contact hole with good coverage due to a shadowing effect as set forth above.

Hence, another method is examined where the substrate is heated to enhance fluidity of the interconnecting material so as to pour the material into the contact hole. For example, when the aluminium alloy is employed as the interconnecting material, the interconnecting material is sputtered while the substrate is heated up to a temperature range of 400° to 500° C., and the interconnecting material is poured into the contact hole so as to improve the coverage.

The conventional thin film deposition apparatus is constructed as set forth above, and the thin film is deposited as set forth above. Therefore, only when the evaporation material has a relatively low melting point, it is possible to employ the method of improving the coverage of the interconnecting film or the diffusion barrier film by heating the substrate during or after the evaporation. Consequently, there are problems as follows: The method can not be applied to the deposition of the diffusion barrier film using a refractory material such as the titanium nitride having an enhanced diffusion barrier performance since a heating temperature is limited in the LSI manufacturing process employing a silicon substrate. Further, it is difficult to deposit the diffusion barrier thin film having good coverage in the contact hole since the contact hole has a higher aspect ratio when an integrated circuit is developed to have a more finer structure, and a higher integrated structure.

SUMMARY OF THE INVENTION

In view of the foregoing, it is an object of the present invention to provide a thin film deposition apparatus which can deposit a thin film, such as a diffusion barrier film, having good coverage a bottom surface and a side surface of a fine groove or a pore which has relatively high a aspect ratio and which is provided in a substrate.

According to the first aspect of the present invention, for achieving the above-mentioned objects, there is provided a thin film deposition apparatus in which evaporation is performed by rotating a substrate and causing a vapor beam of an evaporation material to be diagonally incident on the substrate.

According to the second aspect of the present invention, there is provided a thin film deposition apparatus in which evaporation is performed by disposing evaporation sources immediately under a substrate and setting them such that an incident angle of a vapor beam of an evaporation material on the substrate is not more than a cone angle of a side surface of a fine groove or a pore.

According to the third aspect of the present invention, there is provided a thin film deposition apparatus in which, when the maximum aspect ratio is defined as AR=h/du (a ratio of a depth h of a fine groove or a pore to a width du of the fine groove or a diameter du of the pore), an eccentric distance $L_1$ from a center axis of a substrate to small surface and point sources is set to approximately H/(2×AR) when the small surface and point sources are employed as evaporation sources, or a radius $L_2$ of a ring-shaped source is set to approximately H/(2×AR) when the ring-shaped source is employed as the evaporation sources, and evaporation is performed while the substrate is rotated when the small surface and point sources are used.

According to the fourth aspect of the present invention, there is provided a thin film deposition apparatus in which evaporation is performed by, when two small surface and point sources having a common distance H to a substrate are employed as evaporation sources, rotating the substrate and setting the respective eccentric distances $L_{1a}$ and $L_{1b}$ from the center axis of the substrate to the respective small surface and point sources as follows:

$$R-H/(2\times AR) \leq L_{1a} \leq H/(2\times AR) \leq L_{1b} \leq H/(2\times AR)+L_{1a}$$

where R is a radius of the substrate. Alternatively, the evaporation is performed by, when two ring-shaped sources having the common distance H are employed as the evaporation sources, setting the respective radii $L_{2a}$ and $L_{2b}$ of the ring-shaped sources as follows:

$$R-H/(2\times AR) \leq L_{2a} \leq H/(2\times AR) \leq L_{2b} \leq H/(2\times AR)+L_{2a}$$

According to the fifth aspect of the present invention, there is provided a thin film deposition apparatus in which evaporation is performed by providing a sputtering area of an evaporation material with a diameter which is substantially (e.g.) one-tenth less than a diameter of a substrate, disposing the evaporation material such that the sputtering area is positioned immediately under the substrate, and such that an incident angle of a evaporation material particle on the substrate is not more than a cone angle of a side surface of a fine groove or a pore in the substrate.

According to the sixth aspect of the present invention, there is provided a thin film deposition apparatus in which, when the maximum aspect ratio is defined as AR=h/du (a ratio of a depth h of a fine groove or a pore to a width du of the fine groove or a diameter du of the pore), evaporation is performed by sputtering an evaporation material in an annular fashion, and by setting a radius $L_3$ of an annular sputtering area to approximately H/(2×AR).

According to the seventh aspect of the invention, there is provided a thin film deposition apparatus in which evaporation is performed by, when sputtering areas of an evaporation material are set at two positions having a common distance H to a substrate, setting respective radii $L_{1a}$ and $L_{1b}$ of the respective sputtering areas of the evaporation material as follows:

$$R-H/(2\times AR) \leq L_{1a} \leq H/(2\times AR) \leq L_{1b} \leq H/(2\times AR)+L_1$$

where R is the radius of the substrate.

According to the eighth aspect of the present invention, there is provided a thin film deposition apparatus in which evaporation is performed by introducing a reactive gas into vacuum atmosphere, where the active gas has a molecular weight lower than the mass of an evaporation material particle in a vapor beam of the evaporation material.

According to the ninth aspect of the present invention, there is provided a thin film deposition apparatus in which evaporation is performed by introducing an inactive gas into vacuum atmosphere, where the inactive gas has a molecular weight lower than the mass of an evaporation material particle in a vapor beam of the evaporation material.

According to the tenth aspect of the present invention, there is provided a thin film deposition apparatus in which evaporation is performed by introducing a mixed gas of a reactive gas and an inactive gas into vacuum atmosphere, where the mixed gas has a molecular weight lower than the mass of an evaporation material particle in a vapor beam of an the evaporation material According to the eleventh aspect of the present invention, there is provided a thin film deposition apparatus in which evaporation is performed by introducing the respective gases described in the eighth to the tenth aspects of the invention such that the Knudsen number $K_n=\lambda/H$ (a ratio of a mean free path $\lambda$ of an evaporation material particle in a vapor beam to a distance H between evaporation sources and a substrate) is in an approximate range of 0.1 to 1.

According to the twelfth aspect of the present invention, there is provided a thin film deposition apparatus in which evaporation is performed by introducing a gas into vacuum atmosphere, and setting a pressure of the gas in the vicinity of a surface of a substrate such that the Knudsen number $K_n=\lambda/U$ found by a ratio of a mean free path k of an evaporation material particle in a vapor beam under said pressure to a vertical length U of an area whose pressure is increased by introduction of the gas is in an approximate range of 0.1 to 1.

According to the thirteenth aspect of the present invention, there is provided a thin film deposition apparatus in which evaporation is performed by introducing a gas into vacuum atmosphere, and holding that the Knudsen number $K_n=\lambda/H$ (a ratio of a a pressure of the gas for a predetermined time period such mean free path $\lambda$ of an evaporation material particle in a vapor beam to a distance H between evaporation sources and a substrate becomes approximately 1, and increasing the pressure of the gas after the elapse of the predetermined time period such that the Knudsen number $K_n$ becomes approximately 0.1.

As stated above, in the thin film deposition apparatus according to the present invention, the small surface and point source or the ring-shaped source is disposed at a position which enables irradiation of the fine groove or the pore with the evaporation material particle. Further, the gas having a molecular weight lower than the mass of the evaporation material particle is introduced into the vacuum atmosphere, and an irradiation direction of the evaporation material particle is slightly varied due to collision with a gas molecule. Thereby, it is possible to deposit the thin film with good coverage onto the bottom surface and the side surface of the fine groove or the pore in the substrate.

The above and further objects and novel features of the invention will more fully appear from the following detailed description when the same is read in connection with the accompanying drawing. It is to be expressly understood, however, that the drawings are for purpose of illustration only and are not intended as a definition of the limits of the invention.

DETAILED DESCRIPTION OF THE PREFERRED EMBODIMENTS

Preferred embodiments of the invention will now be described in detail referring to the accompanying drawings.

First, a description will be given for a method of depositing a thin film onto a bottom surface of a contact hole by using a thin film deposition apparatus of the present invention.

In the method of depositing the thin film onto the bottom surface of the contact hole using the thin film deposition apparatus of the present invention, a small surface and point source or a ring-shaped source is employed. Further, the evaporation is performed under a condition that the Knudsen number $K_n=\lambda/H$ (a ratio of a mean free path $\lambda$ of the evaporation material particles to a distance H between the evaporation source and a substrate) becomes 0.1 or more.

Figure 3A:
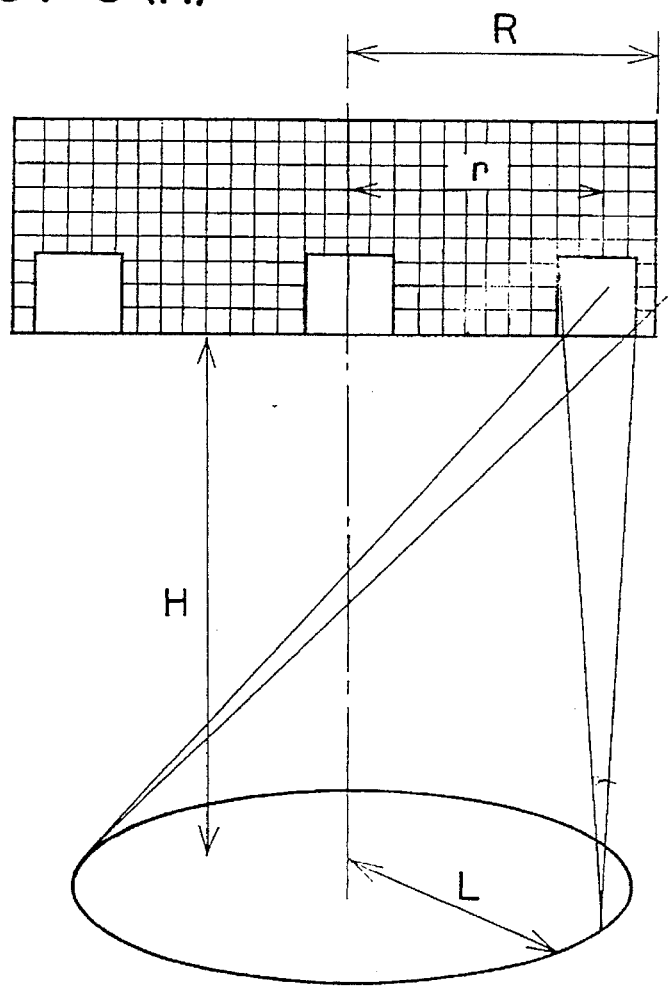
FIGS. 3(A) and 3(B) are diagrams showing a typical arrangement of each part of the thin film deposition apparatus according to the present invention, and a contact hole.
Figure 3B:
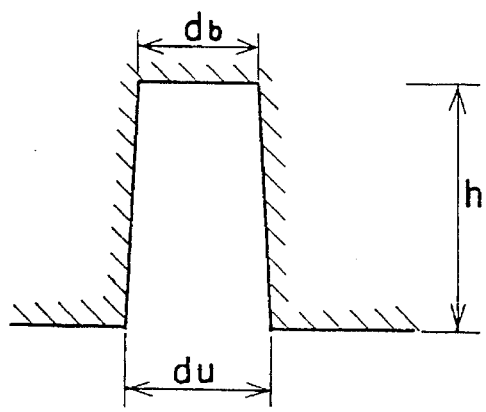

Film thickness profiles of thin films deposited on the bottom surface of the contact hole under such a condition were examined using various positions and relations between the evaporation source and the substrate. As a result, a condition which can provide good coverage was found. As shown in FIG. 3(A), r is a distance from a substrate center to the contact hole, H is the distance between the evaporation source and the substrate, L is an eccentric distance from a substrate center axis to the evaporation source, x is defined as a radial direction in the bottom surface of the contact hole, and y is defined as a circumferential direction. As shown in FIG. 3(B), in each portion of the contact hole, h is a depth, $d_u$ is a diameter of an upper portion of the contact hole, and $d_b$ is a diameter of a lower portion. In this case, the aspect ratio AR is defined by $h/d_u$. Note that the case where a film is deposited during rotation of the substrate by disposing a small surface or point source at a position eccentrically offset by the distance L is geometrically equivalent to the case where the film is deposited without rotating the substrate by using a ring-shaped source having a radius of L. First, when the ring-shaped source having the radius of L is employed, the center of the upper portion of the contact hole describes a circular locus in the bottom surface of the contact hole, and the circular locus can be expressed the following expression (1)

$$(x2\times AR.r/H)^2+y^2=(2\times AR.\ L/H)^2 \quad (1)$$

Figure 4:
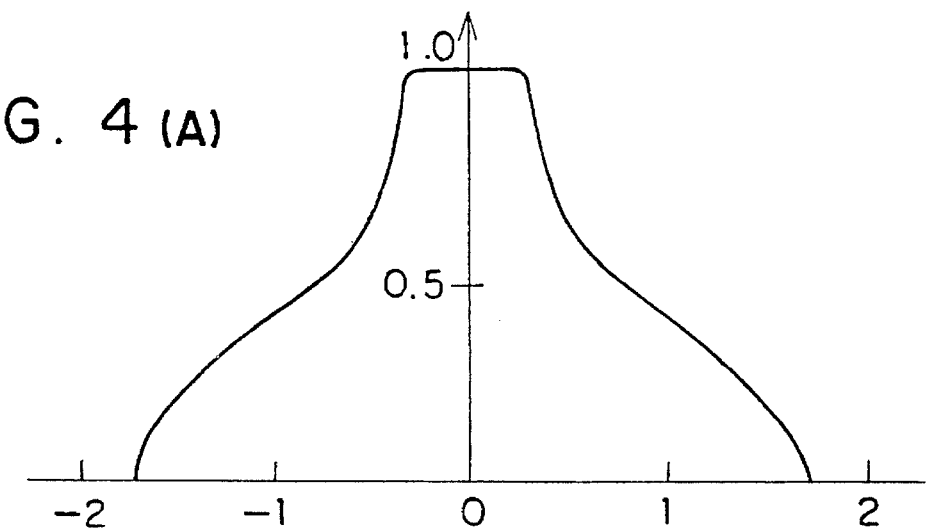
FIGS. 4(A) to 4(C) are diagrams showing typical film thickness profiles of a thin film on a bottom surface of the contact hole, which is deposited by the thin film deposition apparatus according to the present invention.
Figure 4:
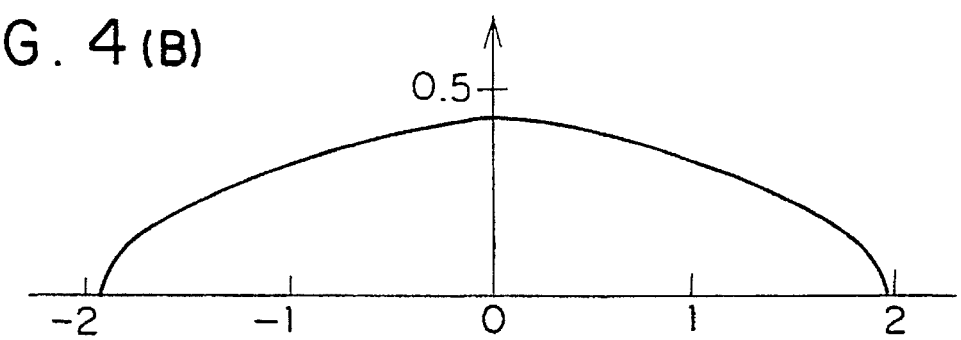
Figure 4:
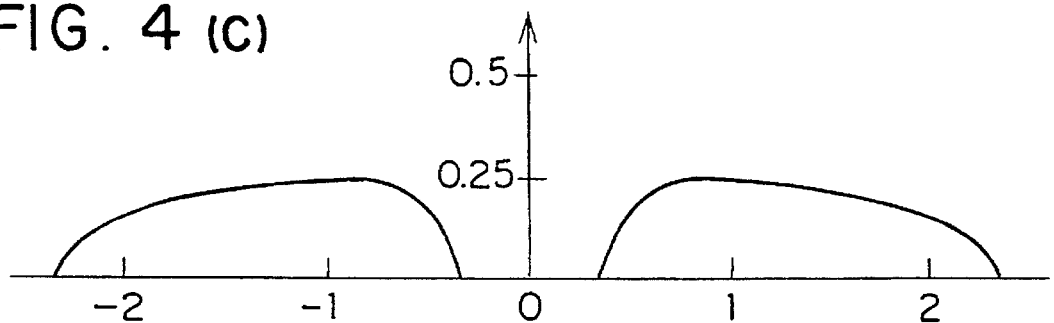

Thus, the film thickness profile on the bottom surface of the contact hole can be calculated by superimposing a circular evaporated film area passing through the upper portion of the contact hole with the locus as a center. The x-coordinate of the center of the locus circle is 2×AR.r/H, and is proportional to the distance r from the substrate center to the contact hole, and a radius of the locus circle is 2×AR.L/H. The film thickness profile varies according to the x-coordinate and the radius. A specific description will now be given of the variation of the film thickness profile with reference to (A)–(B). FIG. 4 shows a film thickness distribution on the bottom portion of the contact hole in an intermediate portion (r=0) of the substrate. In FIG. 4, the transverse axis represents a distance from the center of the bottom portion of the contact hole with the radius of the upper portion as one unit, and the ordinate axis represents the distance with a film thickness of a flat portion of the substrate as one unit.

Figure 5:
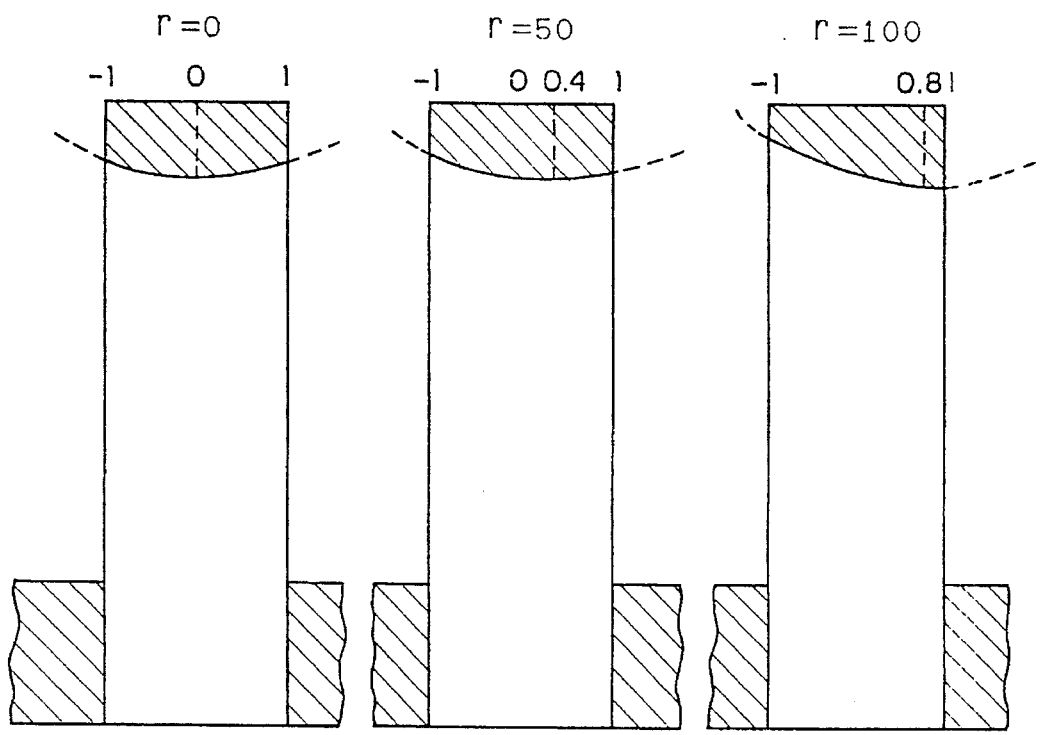
FIG. 5 is a diagram showing dependency of the film thickness profile of the thin film on the bottom surface of the contact hole, which is deposited by the thin film deposition apparatus according to the present invention, on a distance from the constant hole to a substrate center.

When the distance H between the evaporation source and the substrate, the eccentric distance L from the substrate center axis to the evaporation source, and the aspect ratio AR are set such that $$L < H/(2 \times AR) \tag{2}$$

there is provided a stratovolcano-shaded distribution of the film thickness profile in which the intermediate portion has the same film thickness as that of the upper surface of the substrate, and skirts on both sides thereof are described as shown in FIG. 4(A). If the deposited thin film is a diffusion barrier thin film, there is little variation in the aspect ratio of the contact hole even once the thin film is deposited because the film thickness is much less than a height h of the contact hole. Thus, the film thickness profile on the bottom surface of the contact hole exclusively depends upon the position and relation between the substrate and the evaporation source, and the aspect ratio of the contact hole. FIG. 5 shows the dependency of the film thickness profile on the distance r spaced from the substrate center. As is apparent from FIG. 5, though a distance between a center of the film thickness profile and the center of the contact hole is varied in proportional to r, there is no variation in a form of the profile.

Alternatively, when the distance H between the evaporation source and the substrate, the eccentric distance L from the substrate center axis to the evaporation source, and the aspect are set such that $$L > H/(2 \times AR) \tag{3}$$

there is provided a substantially flat and peltate-shaped distribution of the film thickness profile as shown in FIG. 4(B).

Further, when the distance H between the evaporation source and the substrate, the eccentric distance L from the substrate center axis to the evaporation source, and the aspect ratio AR are set such that $$L \geq H/(2 \times AR) \tag{4}$$

the film thickness profile exhibits a caldera-shaped distribution in which there is a non-evaporated film portion at an intermediate portion as shown in FIG. 4(C).

The present invention is provided in accordance with the above analysis to specify a condition which enables the deposition of the film onto the bottom surface of the contact hole with a film thickness of 10% or more of that on the substrate upper surface, and with a platter film thickness profile. A description will be hereinafter given of each embodiment of the present invention with reference to the drawings.

Embodiment 1

Figure 6:
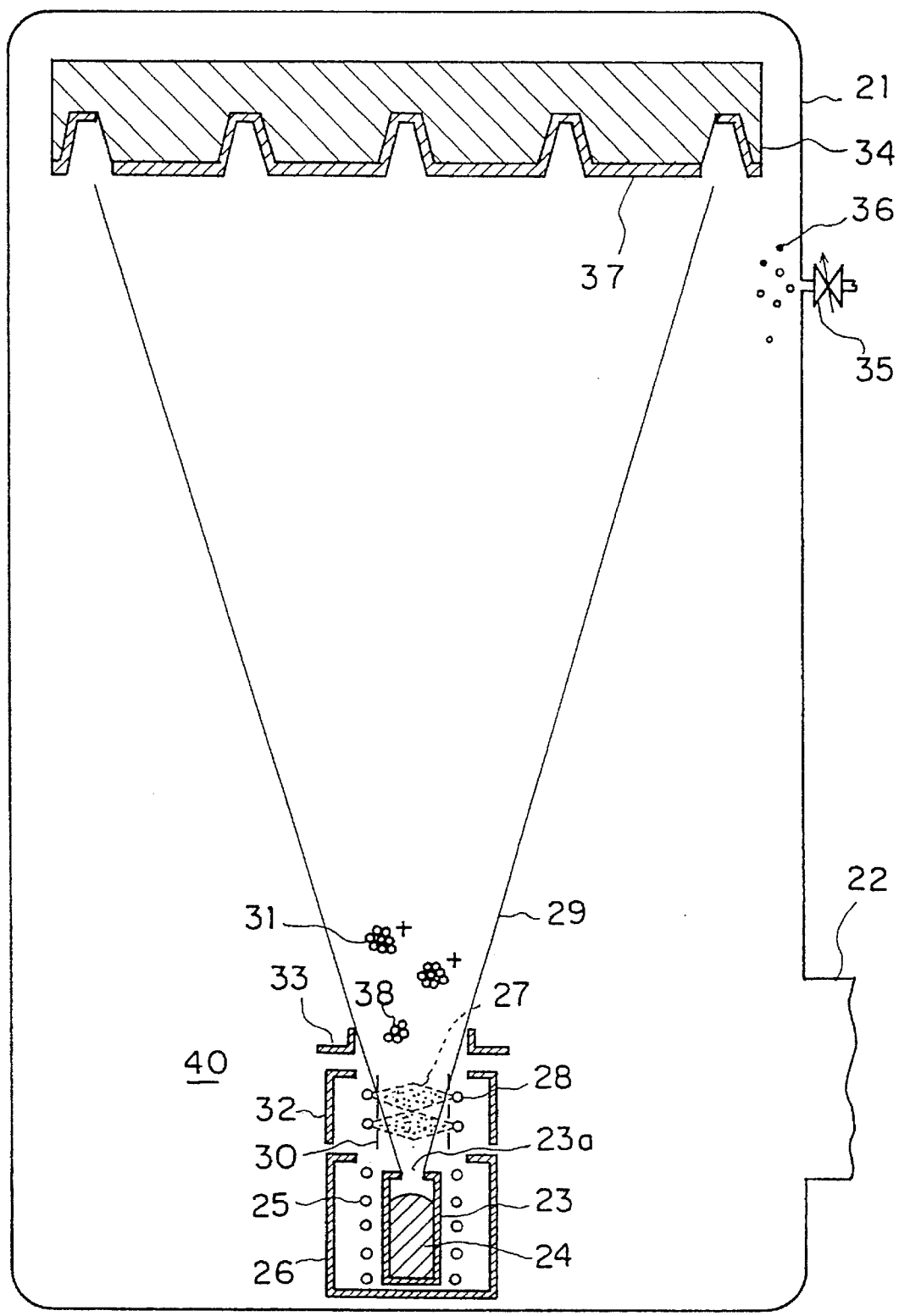
FIG. 6 is a sectional view showing an essential part of a typical thin film deposition apparatus according to embodiment 1 of the present invention.

FIG. 6 is a sectional view showing an essential part of a typical thin film deposition apparatus according to embodiment 1 of the present invention. In FIG. 6, reference numeral 21 indicates a vacuum tank which is connected to a high-evacuation system (not shown) through an exhaust passage 22, 23 indicates an enclosed crucible in which a nozzle 23a is formed at an upper portion, and the crucible 23 is filled with titanium (Ti) as an evaporation material 24. Reference numeral 25 indicates a heating filament to heat the crucible 23, and a heat shield plate 26 is disposed externally to the heating filament 25. Further, above the crucible 23, there are disposed an ionizing filament 28, to emit thermoelectrons 27 for ionization, and an electron extracting electrode 30, to extract the thermoelectron 27 from the ionizing filament 28 so as to irradiate a beam 29 of the evaporation material 24 with the thermoelectron 27. The evaporation material beam 29 includes a cluster 31 in which a plurality of atoms of the evaporation material 24 are loosely combined. A heat shield plate 32 to cut off radiation heat is mounted externally to the ionizing filament 28. Further, reference numeral 33 indicates an accelerating electrode to accelerate and cause the ionized cluster ion 31 to collide with a substrate 34, 35 is a valve to adjust an amount of a helium gas 36 which is introduced into the vacuum tank 21, and 37 is a titanium thin film formed on the substrate 34. Those components identified by reference numerals 23 to 26, 28, 30, 32, and 33 or the like are provided to form a cluster ion beam source 40 serving as the small surface and point source described above. A silicon wafer having a diameter in a range of 150 to 200 mm is employed as the substrate 6, and the cluster ion beam source 40 is disposed immediately under a center axis of the substrate 34.

In a contact hole, a horizontal section may have an oval or elliptical form rather than a completely circular form. Further, the contact hole may have a largely tapered upper portion or the like. Therefore, an aspect ratio is preferably calculated by using dimensions of appropriate portions according to forms of the contact hole. A cone angle θ of a side surface of the contact hole can be found by the following expression (5)

$$\theta = \arctan\{(d_u - d_b)/h\} \tag{5}$$

Further, a distance between the evaporation source and the substrate 34 is set in a range which is expressed by the following expression (6)

$$R/H \leq \tan(\theta) \tag{6}$$

such that a thin film can be deposited even onto a bottom surface of a contact hole which is provided on the outermost peripheral side of the substrate 34.

A description will now be given of the operation. First, after the vacuum tank 21 is evacuated to a pressure level of $10^{-4}$ Pa (about $10^{-5}$ Torr), the valve 35 is adjusted to introduce the helium gas 36 into the vacuum tank 21 to a pressure range of $10^{-2}$ to $10^{-1}$ Pa. Next, the heating filament 25 is energized and heated to heat the crucible 23 and the thermoelectrons 27 so as to evaporate the evaporation material 24. If the crucible 23 is heated until vapor pressure of the evaporation material 24 reaches 1 to $10^3$ Pa ($10^{-2}$ to several tens Torr), the vapor beam 29 of the evaporation material is ejected from the nozzle 23a. At this time, in the vapor beam 29 of the evaporation material, a lump-shaped atomic group, that is, a cluster 38 in which many atoms are loosely combined is formed by adiabatic expansion caused due to a difference between the pressure in the crucible 23 and an external pressure. The ionizing filament 28 irradiates the vapor beam 29 of the evaporation material with the thermoelectron 27. Thereby, one atom in the cluster 38 is ionized to form a cluster ion 31. The cluster ion 31 is appropriately accelerated by an electric field generated between the accelerating electrode 33 and the electron extracting electrode 30. Further, the cluster ion 31 collides with the substrate 34 mounted to a substrate holding station (not shown) together with an unionized neutral cluster 38, resulting in formation of the titanium thin film 37 serving as a backing of a diffusion barrier film.

If there is employed the cluster ion beam 40 of the small surface and point source which is disposed at the position as set forth above, the helium gas 36 is introduced to deposit the thin film with pressure in a range of $10^{-2}$ to $10^{-1}$ Pa, resulting in a mean free path of the evaporation material particles in a range of about 3.5 to 35 cm, and the Knudsen number in a range of about 0.1 to 1. Consequently, the evaporation material particles such as the cluster 38 in the vapor beam 29 of the evaporation material emitted from the cluster ion beam source 40 collide with the helium gas atom 36 one time to ten times on the average, and can thereafter reach the substrate 34 (the average number of collisions of the evaporation material particles substantially corresponding to the inverse of the Knudsen number). The mass of the evaporation material particles such as the cluster 38 is ten times or more than mass the of the helium gas atoms, and a scattering angle of the evaporation material particle for one collision is about 5° or less i.e., relatively small. Therefore, the evaporation material particle can be incident on the bottom surface or the side surface of the contact hole which can not be seen from the cluster ion beam source 40. Further, the angle of incidence can be reduced so that the titanium thin film 37 can be deposited onto the bottom surface and the side surface of the contact hole with good coverage without deceleration of a deposition rate.

Embodiment 2

The embodiment 1 has been described with reference to a case where the titanium is employed as the evaporation material 24, and the helium gas 36 is employed as a gas introduced into the vacuum tank 21. However, for example, gold or tungsten may be employed as the evaporation material 24, and a neon gas may be introduced into the vacuum tank 21 instead of the helium gas 36 so as to form a gold or tungsten thin film. In this case, it is possible to expect the same effect as that in embodiment 1 since the mass of the evaporation material is about ten times the mass of atoms of the neon gas. Alternatively, if the helium gas is employed for the gold or tungsten, a mass ratio becomes about 50 times. Accordingly, it is possible to deposit the thin film with greater coverage since the scattering angle at a time of collision can be reduced more than it can be when the neon gas is used. As set forth above, computer simulation confirms that the thin film can be deposited with good coverage if a mass ratio of the mass of an evaporation material particle to the mass of a gas molecule is in an approximate range of about 10 to 50 times.

Embodiment 3

Figure 7:
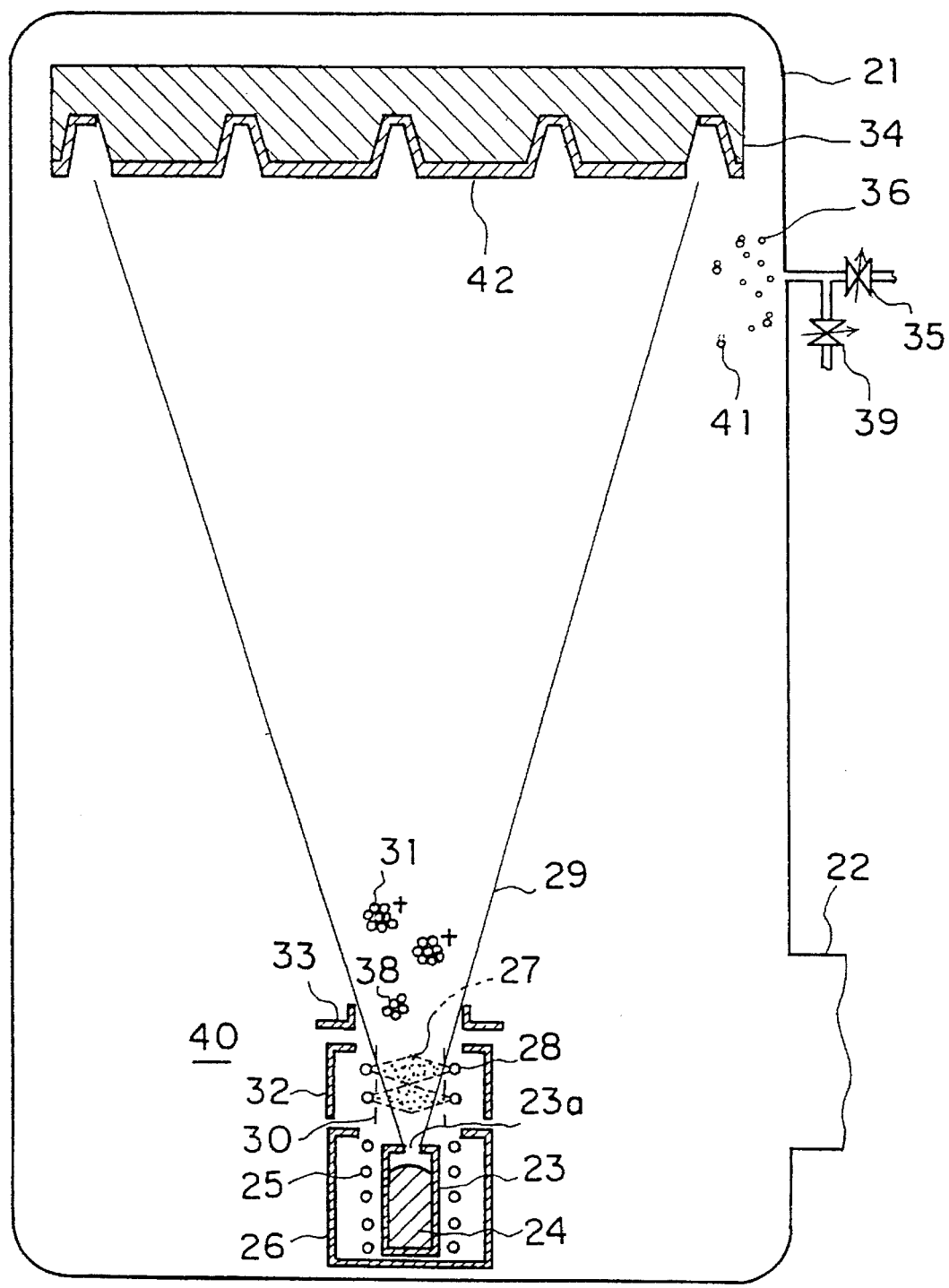
FIG. 7 is a sectional view showing an essential part of a typical thin film deposition apparatus according to embodiment 3 of the present invention.

FIG. 7 is a sectional view showing an essential part of a typical thin film deposition apparatus according to embodiment 3 of the present invention. In FIG. 7, the same reference numerals are used for those component parts which are identical to those of the thin film deposition apparatus according to embodiment 1 shown in FIG. 6, and descriptions thereof are omitted. In FIG. 7, reference numeral 39 indicates a valve to adjust an amount of a nitrogen gas 41 which is introduced into a vacuum tank 21, and 42 indicates a titanium nitride diffusion barrier thin film deposited onto a substrate 34.

A description will now be given of the operation. First, a valve 35 is closed to evacuate a helium gas 36 in the vacuum tank 21, and the valve 39 is adjusted to introduce the nitrogen gas 41 into the vacuum tank 21 to a pressure range of $10^{-3}$ to $10^{-2}$ Pa. Next, the valve 35 is adjusted to introduce the helium gas 36 such that the Knudsen number is in a range of 0.1 to 1. Thereafter, as in the case of the deposition of the titanium thin film 37 in the embodiment 1, a crucible 23 is heated to eject a vapor beam 29 of the evaporation material from a nozzle 23a so as to form a cluster 38. The cluster 38 is partially ionized to form a cluster ion 31, and the cluster ion 31 is appropriately accelerated by an electric field to collide with the substrate 34. At this time, the vapor beam 29 of the evaporation material is combined with nitrogen on the substrate 34 to form a titanium nitride film, that is, the diffusion barrier thin film 42.

According to the embodiment 3 described before, since the nitrogen gas 41 is introduced into the vacuum tank 21 as a reactive gas, a nitrogen gas molecule plays the same role as that of the helium atom in the case of the deposition of the titanium thin film in embodiment 1. Therefore, the evaporation material particles such as the cluster 38 emitted from a cluster ion beam source 40 collide with these nitrogen gas molecules, and thereafter with the substrate 34. However, pressure of the nitrogen gas 41 required to nitride is lower than that of the helium gas 36 in embodiment 1, and the Knudsen number in this condition is more than 1. The evaporation material particles collide with the substrate 34 rather than the nitrogen gas molecules at high rates. Hence, the helium gas 41 is introduced to rise pressure so as to reduce the Knudsen number to be in a range of 0.1 to 1. As set forth above, it is possible to deposit the diffusion barrier thin film 42 of the titanium nitride onto the bottom surface and the side surface of the contact hole with good coverage by introducing the helium gas 36 having a low molecular weight in addition to the reactive nitrogen gas 41. In this case, the helium gas 36 is introduced to increase gas pressure, instead of increasing an amount of the nitrogen gas 41, in order to reduce the Knudsen number to be in the range of 0.1 to 1. This is because the nitrogen gas molecule is seven times as heavy as the helium gas atom, and therefore, the scattering angle of the evaporation particle for one collision increases, and results in an increased amount of the particle which can not enter the contact hole.

Embodiment 4

Figure 8:
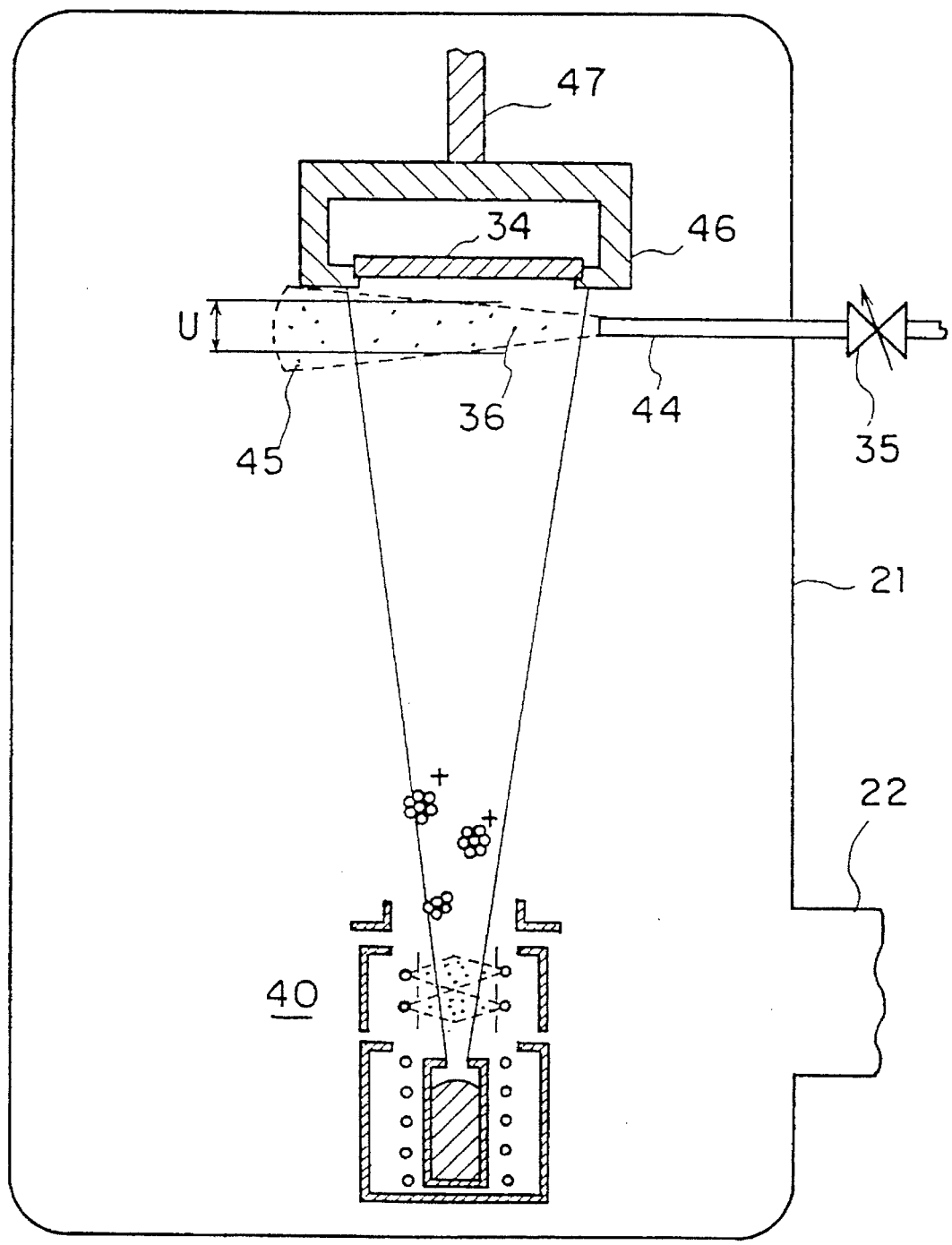
FIG. 8 is a sectional view showing an essential part of a typical thin film deposition apparatus according to the embodiment 4 of the present invention.

FIG. 8 is a sectional view typically showing an essential part of a thin film deposition apparatus according to embodiment 4. of the present invention. In FIG. 8, the same reference numerals are used for those component parts which are identical to those of the thin film deposition apparatus according to the embodiments 1 and 2 shown in FIGS. 6 and 7, and descriptions thereof are omitted. In FIG. 8, reference numeral 44 indicates a nozzle connected to a valve 35 so as to feed a helium gas 36 to a position immediately under a substrate 34, 45 is an area in which pressure is increased in an approximate pressure range of $10^{-1}$ or 1 Pa by the helium gas 36 fed through the nozzle 44, and U indicates a length of said area in a direction perpendicular to the substrate 34. Further, reference numeral 46 indicates a substrate holding station to hold the substrate 34 so as to provide an inplane rotation and 47 is a rotary shaft to support the substrate holding station 46 and to rotate the substrate holding station 46 by torque generated externally to a vacuum tank 21.

According to the embodiment 4 described hereinbefore, the valve 35 is adjusted to introduce the helium gas 36 through the nozzle 44 to the position immediately under the substrate 34 so as to form the area 45 in which a gas pressure is increased. The Knudsen number $K_n=\lambda/U$ (a ratio of a mean free path $\lambda$ of evaporation material particles in the area 45 and the vertical length U of the area 45), and is set to be in a range of 0.1 to 1. Consequently, the evaporation material particles collide with the helium gas atoms 36 in the area 45, and thereafter with the substrate 34. As a result, it is possible to deposit the thin film onto a bottom surface and a side surface of the contact hole with good coverage.

In the embodiment 4 described hereinbefore, when the nozzle 44 is disposed as shown in FIG. 8, the helium gas 36 ejected-from the nozzle 44 travels in a direction on the left side in FIG. 8. Therefore, the evaporation material particles are scattered only on the left side after the collision, and there is no deposited film on the right side in the contact hole (not shown). Hence, if the substrate holding station 46 is rotated externally to the vacuum tank 21 through the rotary shaft 47, it is possible to uniformly deposit the film onto all surfaces in the contact hole.

Embodiment 5

In the embodiment 4 described hereinbefore, a thin film is uniformly deposited onto all surfaces in a contact hole by rotating a substrate holding station 46 holding a substrate 34. However, a plurality of nozzles 44 may be disposed around the substrate to introduce a helium gas 36 through the respective nozzles 44 so as to provide the same effect as that in the above embodiment 4.

Embodiment 6

In the above embodiments, a predetermined amount of a helium gas 36 is introduced into a vacuum tank 21 such that the Knudsen number becomes a given value in a range of 0.1 to 1. However, the introduction of the helium gas 36 during deposition may be varied with the passage of time as follows: The valve 35 is restricted to reduce the introduction of the helium gas 36 for an initial period of the deposition, and the valve 35 is opened to increase the introduction of the helium gas 36 for a later period of the deposition. It is thereby possible to deposit the film onto a bottom surface and a side surface of a contact hole with improved coverage.

That is, pressure of the helium gas 36 is reduced to set the Knudsen number to 1 so as to provide a condition where there is little collision of evaporation material particles. The deposition is performed in this condition to sufficiently deposit the evaporation material particles, which perpendicularly collide with a substrate 34, onto a bottom portion of the contact hole for the initial period of deposition. Thereafter, the pressure is increased to set the Knudsen number to 0.1, and the deposition is performed in a condition where collision of the evaporation material particles occurs frequently. Thereby, the evaporation material particles diagonally colliding with the substrate 34 may be deposited onto the side surface of the contact hole for the later period of deposition.

Embodiment 7

The above embodiments have been described with reference to a case where a helium gas 36 is employed as an inactive gas introduced into a vacuum tank 21. However, it must be noted that the present invention should not be limited to the helium gas, and may employ any other gases which have a molecular weight lower than the mass of an evaporation material particle in an evaporation material beam 29, and are irrelevant to reaction on a substrate 34. Further, as the molecular weight of the gas becomes lower, a scattering angle of the evaporation material particle for one collision further decreases, resulting in a more advantageous condition for depositing a uniform film.

Embodiment 8

Figure 9:
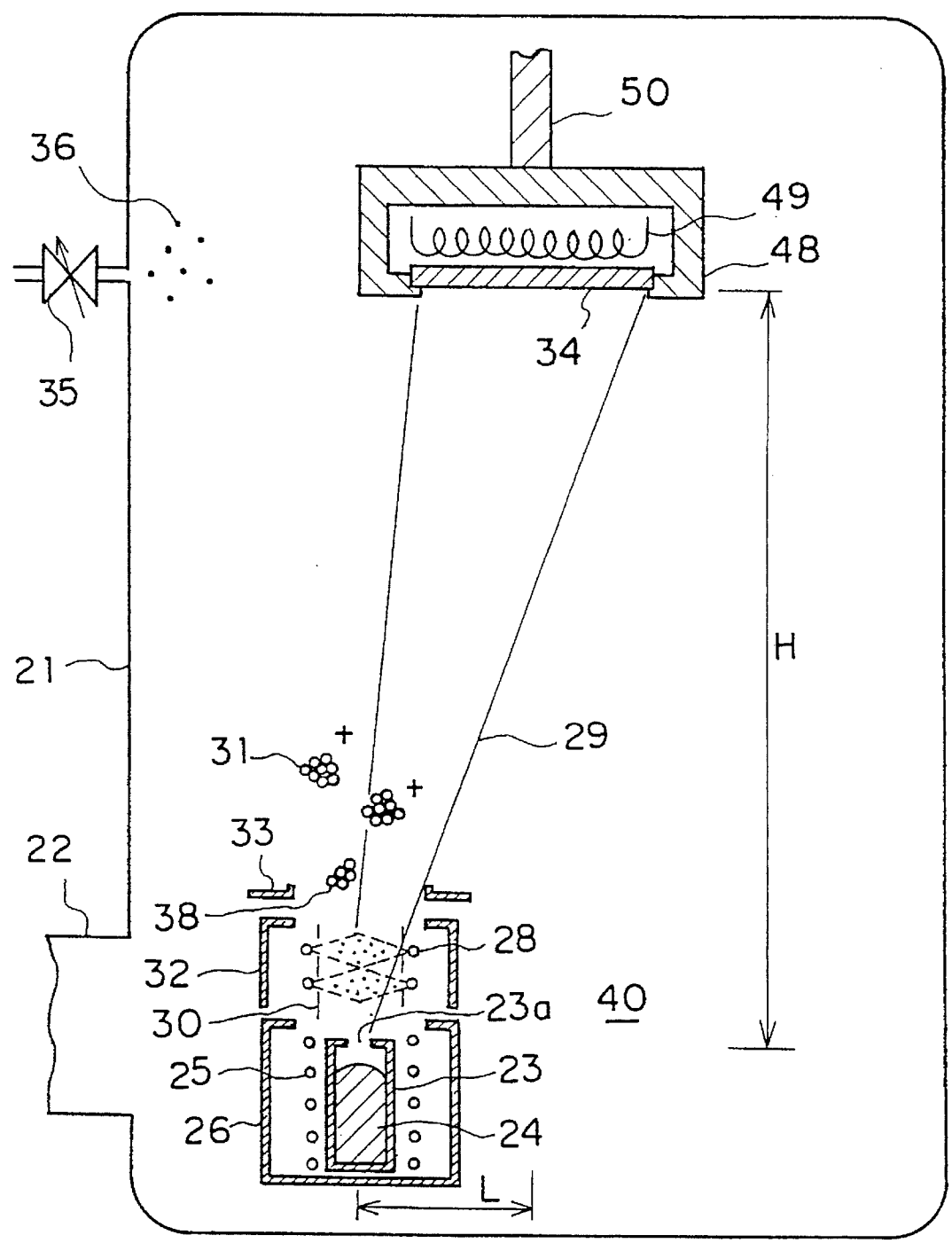
FIG. 9 is a sectional view showing an essential part of a typical thin film deposition apparatus according to the embodiment 8 of the present invention.

FIG. 9 is a sectional view showing an essential part of a typical thin film deposition apparatus according to embodiment 8 of the present invention. In FIG. 9, the same reference numerals are used for those component parts which are identical to those of the thin film deposition apparatus according to embodiment 1 shown in FIG. 6, and descriptions thereof are omitted. In FIG. 9, reference numeral 48 indicates a substrate holding station to hold and heat a substrate 34 and provide an in-plane rotation, and the substrate holding station 48 includes a heater 49. Further, reference numeral 50 indicates a rotary shaft to support the substrate holding station 48, and to rotate the substrate holding station by using torque applied externally to a vacuum tank.

A cluster ion beam source 40 is disposed at a position eccentrically offset from a rotary center axis of the substrate 34 by a distance L. The eccentric distance L is set in a range of −20 to +20% of a value determined by the above expression (3), that is, the eccentric distance L is specifically set in a range as expressed by the following expression (7)

$$0.8 \times H/(2 \times AR) \leq L \leq 1.2 \times H/(2 \times AR) \qquad (7)$$

In the thin film deposition apparatus according to embodiment 8 constructed as described above, for example, a silicon wafer having a radius of 100 mm may be employed as the substrate 34. The silicon wafer is provided with a contact hole having a maximum aspect ratio of 2.8. With the silicon wafer, evaporation was performed using same operation as that in embodiment 1 under such a condition that H was set to 700 mm, and L was set to 120 mm so as to provide an evaporation speed of 5 nm/min. Ten rpm (revolutions per minute) was used as a rotational speed for the substrate 34. Accordingly, it was possible to deposit a titanium thin film 37 onto a bottom surface of the contact hole in all surfaces of the substrate with coverage of 50% or more.

The distance H between the cluster ion beam source 40 and the substrate 34 is preferably set such that a given coverage can be ensured in a contact hole in an end of the substrate 34 according to the maximum radius R of the substrate 34. For example, in order to ensure coverage of 20% or more in a contact hole in the end of a substrate 34 having the radius of 100 mm, the distance H from the cluster ion beam source 40 to the substrate 34 may be found by the following expression (8)

$$(2 \times AR \times R)/(1.6-d_b/d_u) \leq H \qquad (8)$$

where the value of 1.6, in the denominator of the above expression, corresponds to a position at which a peltate-shaped film thickness profile in the bottom surface of the contact hole reaches 20%.

Embodiment 9

The above embodiment 8 has been described with reference to a case where only one cluster ion beam source 40 is disposed as an evaporation source at a position eccentrically offset from a rotary center axis of the substrate 34 by a distance L. However, a plurality of cluster ion beam sources may be disposed on a common circle having the distance L as its radius to perform evaporation. It is thereby possible to naturally provide the same effect as that in embodiment 8, and to increase an evaporation speed because of the plurality of evaporation sources.

Embodiment 10

Figure 10:
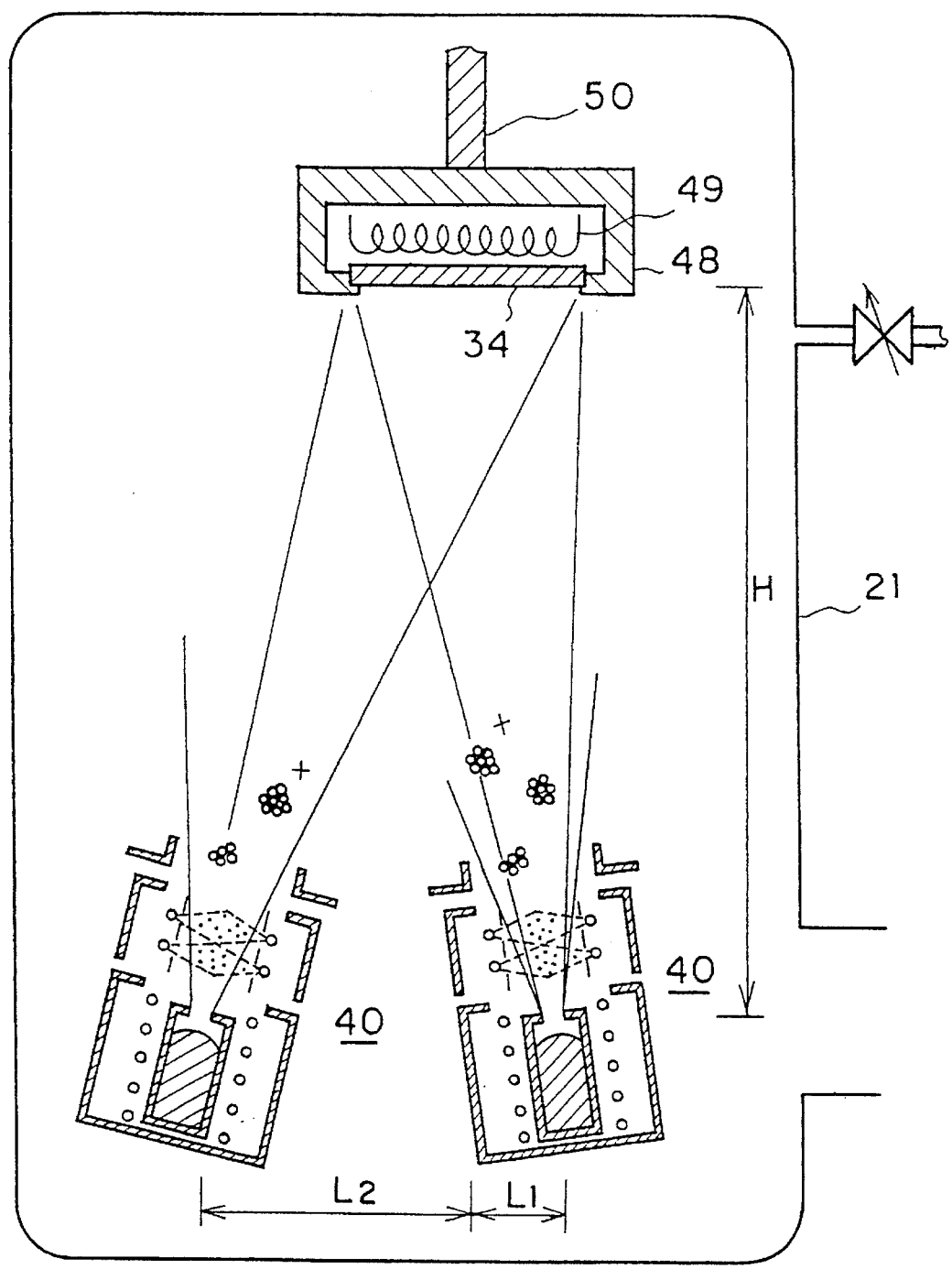
FIG. 10 is a sectional view showing an essential part of a typical thin film deposition apparatus according to the embodiment 10 of the present invention.

FIG. 10 is a sectional view showing an essential part of a typical film deposition apparatus according to the embodiment 10 of present invention. As shown in FIG. 10, cluster ion beam sources 40 are employed as small surface or point sources as in the above embodiments, and are respectively disposed through eccentric distances $L_1$, $L_2$ from a rotary center axis of a substrate 34. The respective eccentric distances $L_1$, $L_2$ are set in a range expressed by the following expression 9)

$$R-H/(2\times AR) \leq L_1 \leq H/(2\times AR) \leq L_2 \leq H/(2\times AR)+L_1 \qquad (9)$$

Two cluster ion beam sources 40 disposed as described before are operated so as to have substantially the same beam intensity. When a silicon wafer having a radius of 100 mm is employed as the substrate 34, and the silicon wafer is provided with a contact hole having the maximum aspect ratio of 2.8, for H=700 mm, conditions for $L_1$ and $L_2$ are expressed by the following expression (10)

$$12.5 \leq L_1 \leq 87.5 \leq L_2 \leq 87.5+L_1 \qquad (10)$$

As an example, evaporation was performed under such a condition that $L_1$ is set to 80 mm, $L_2$ is set to 160 mm so as to provide 5 nm/min in the beam intensity (evaporation speed) from the respective cluster ion beam sources 40, and 10 rpm in a rotational speed of the substrate 34. Accordingly, it was possible to deposit a titanium nitride thin film onto a bottom surface of the contact hole in all surfaces of the substrate with coverage of 50% or more.

Figure 11:
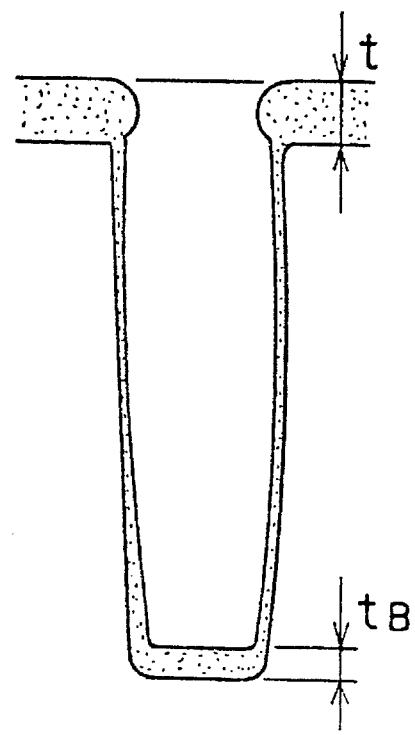
FIGS. 11(A) and 11(B) are diagrams showing a comparison between a condition of a thin film on a bottom surface of a contact hole, deposited by the thin film deposition apparatus in embodiment 10, and the condition of a thin film on the bottom surface of the contact hole, deposited by the conventional sputtering method.
Figure 11:
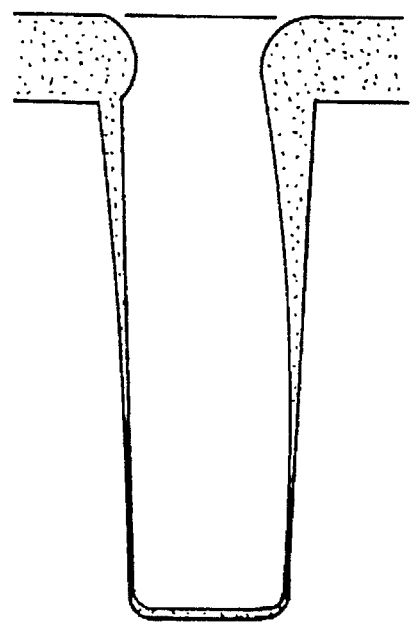

FIGS. 11(A) and 11(B) are diagrams showing a comparison between a cross-section of the contact hole in the embodiment 10 evaporated as set forth above and a cross-section of a contact hole evaporated by a conventional sputtering method. FIG. 11(A) is a diagram showing a typical result using embodiment 10, and FIG. 11(B) is a diagram showing a typical result using the conventional sputtering method.

As is also apparent from the drawings, evaporation according to embodiment 10 of the present invention can achieve 50% in bottom coverage ($t_B/t$) of the contact hole, while evaporation according to the conventional sputtering method achieves only 3% in the bottom coverage of the contact hole.

Figure 12:
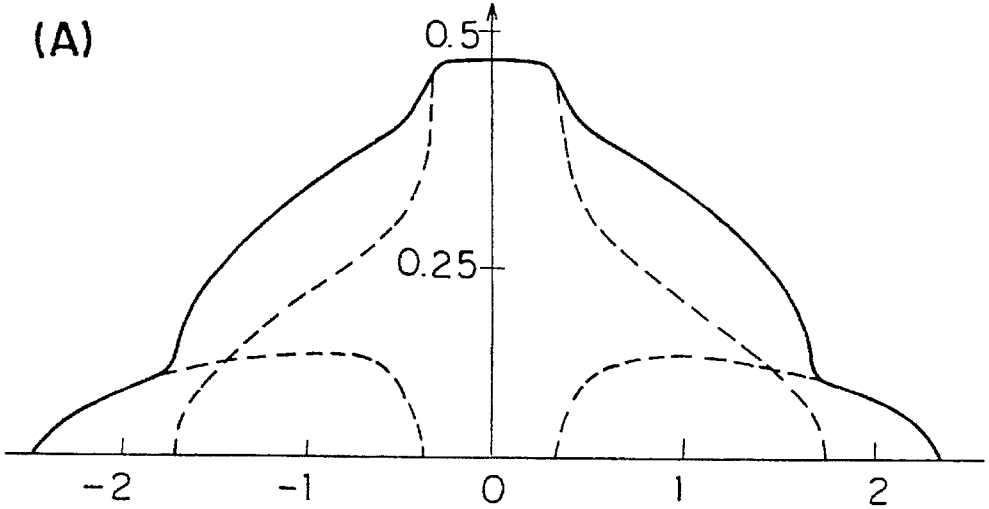
FIGS. 12(A) and 12(B) are diagrams respectively showing typical film thickness profiles of thin films on the bottom surface of the contact hole, deposited by the thin film deposition apparatus in embodiments 10 and 11 of the present invention.
Figure 12:
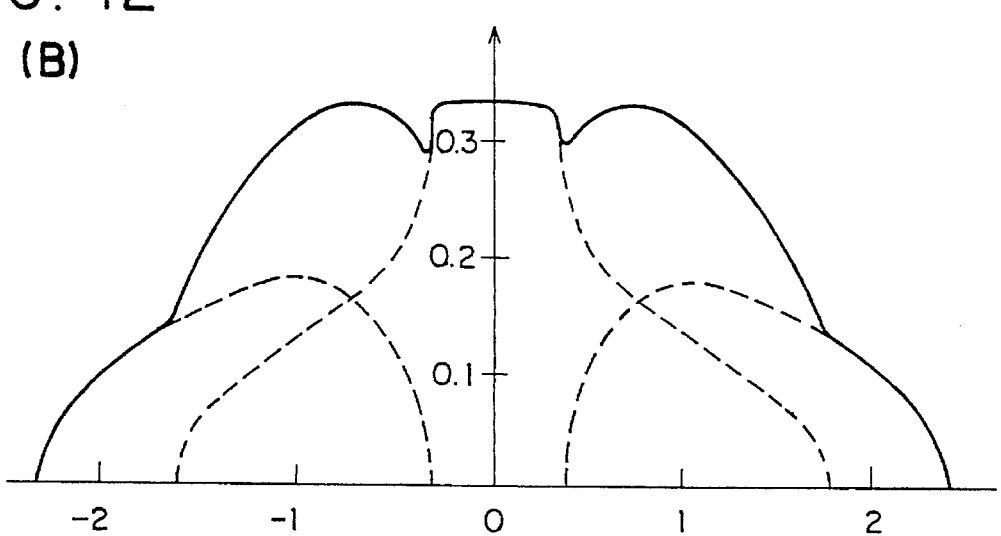

In brief, the above embodiment 10 is provided to combine profiles in FIGS. 4(A) and 4(C) so as to provide a more flat film thickness profile. The expression (1), i.e., the above locus expression, shows that a center of the locus can stay at an original position even if L is changed when H is not changed. Making use of that fact, the film thickness profile in embodiment 10 is obtained by superimposing the caldera-shaped profile on a foot portion of the stratovolcano-shaped profile. The film thickness profile of the bottom surface of the contact hole is provided as shown in FIG. 12. (A) and (B)

Embodiment 11

The above embodiment 10 has been described with reference to a case where two cluster ion beam sources 40 have a common evaporation speed. However, for example, an evaporation speed from the cluster ion beam source 40 disposed at an eccentric distance $L_2$ may be 1.5 to 4 times the evaporation speed from the cluster ion beam source 40 disposed at an eccentric distance $L_1$. In this case, it is possible to provide a more uniform film thickness profile on a bottom surface of a contact hole as shown in FIG. 12(B).

Embodiment 12

Alternatively, for example, one cluster ion beam source 40 may be disposed at an eccentric distance $L_1$, and two to four cluster ion beam sources 40 may be disposed at an eccentric distance $L_2$. It is thereby possible to provide the same effect as that in the above embodiment 11 even if the same evaporation speed is provided from the respective cluster ion beam sources 40.

Embodiment 13

The above embodiments 10 and 12 have been described with reference to a case where cluster ion beam sources 40 are disposed at two positions defined by eccentric distances $L_1$, $L_2$ which satisfy the above expressions (2) and (4). However, it is to be understood that the present invention may be applied to a case the cluster ion beam sources 40 are disposed at positions defined by three or more eccentric distances.

Embodiment 14

The above embodiments have been illustrated with reference to a case where a plurality of evaporation sources are disposed to have a common distance H between a substrate and the evaporation source so as to provide each film thickness profile with a common center. However, the plurality of evaporation sources may be employed with different distances between the evaporation sources and the substrate for deposition in order to provide a predetermined coverage.

Embodiment 15

The above embodiments have been illustrated with reference to a case where a cluster ion beam source is employed as an evaporation source. However, the present invention may employ a small surface and point type or annular type evaporation material generating source, and any type of deposition method which enables the deposition in such a condition that the Knudsen number $K_n=\lambda/H$ (a found by a ratio of a mean free path $\lambda$ of an evaporation material particle to a distance H between the evaporation source and a substrate) is in a range of 0.1 to 1. For example, an electron beam evaporation source serving as the small surface and point source may be employed instead of the cluster ion beam source, and the evaporation source and the substrate may be disposed at positions as set forth above so as to perform deposition while rotating the substrate. Alternatively, a plurality of small resistance heating boat evaporation sources may be disposed on a concentric circle having a radius of L to form a ring-shaped source so as to perform the deposition without rotation of the substrate. In this case, if there is provided a station to automatically feed a linear evaporation material, it is possible to enhance throughput of the deposition.

Embodiment 16

Figure 1:
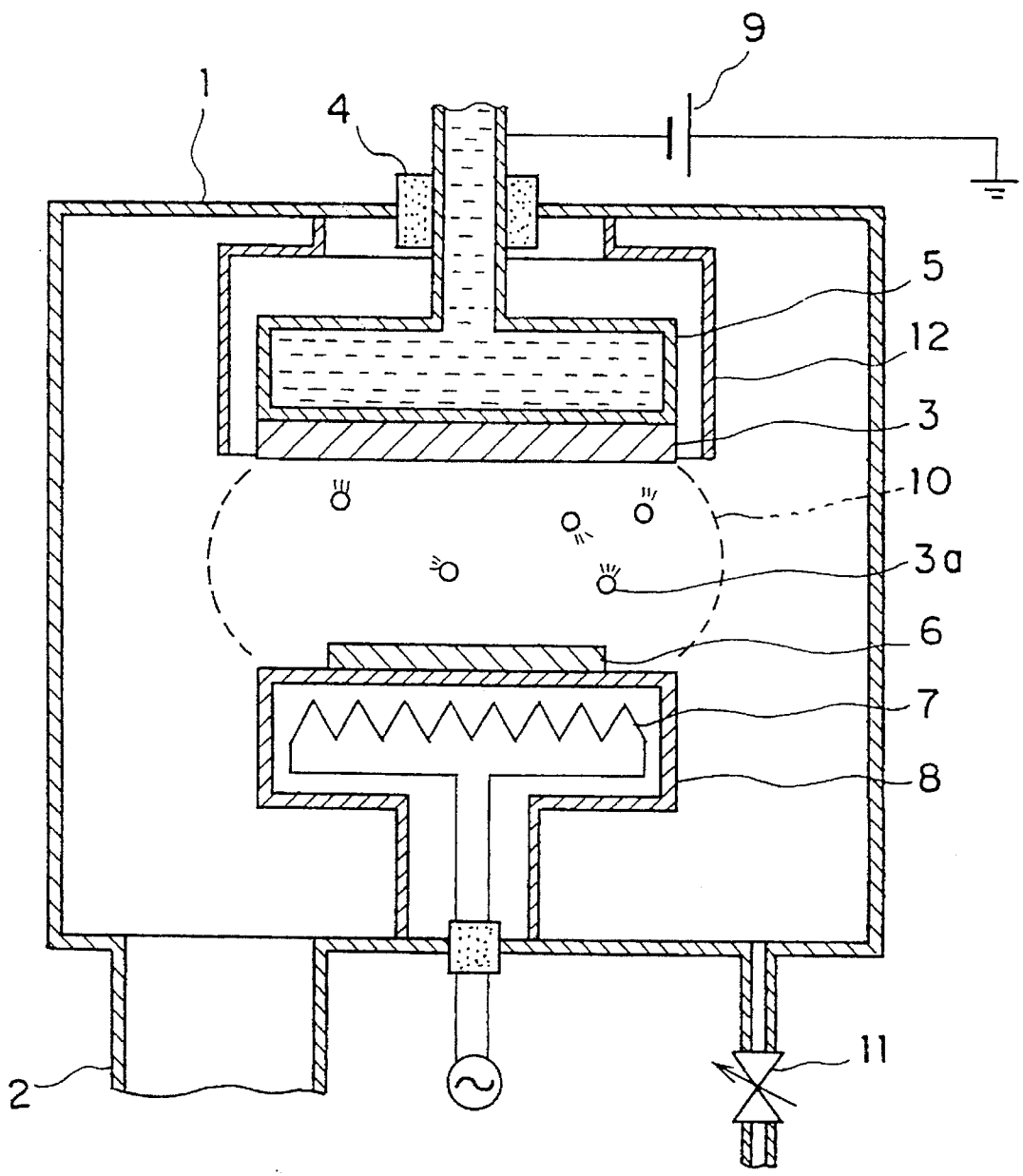
FIG. 1 is a sectional view showing an essential part of a typical thin film deposition apparatus employing a conventional sputtering method.
Figure 2A:
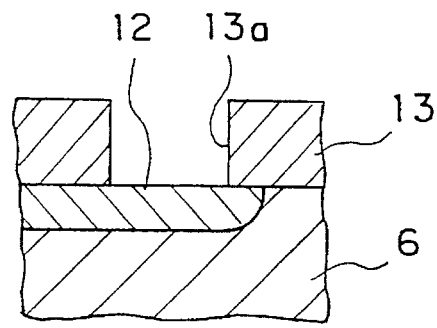
FIGS. 2(A) to 2(D) are diagrams showing a typical process for depositing a multilayer interconnection film into a contact hole using the thin film deposition apparatus shown in FIG. 1.
Figure 2B:
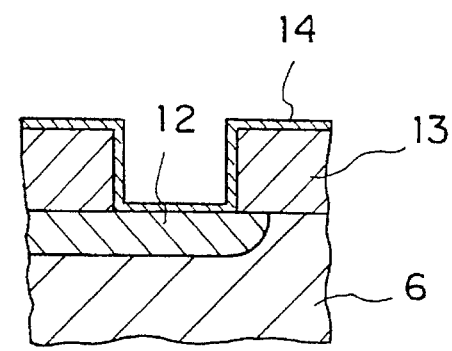
Figure 2C:
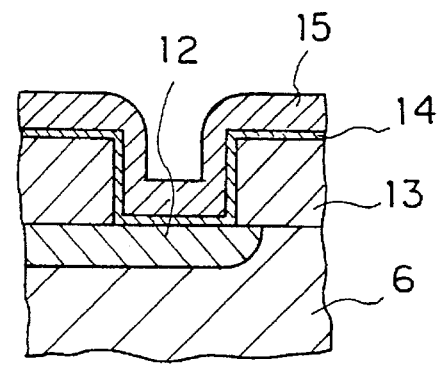
Figure 2D:
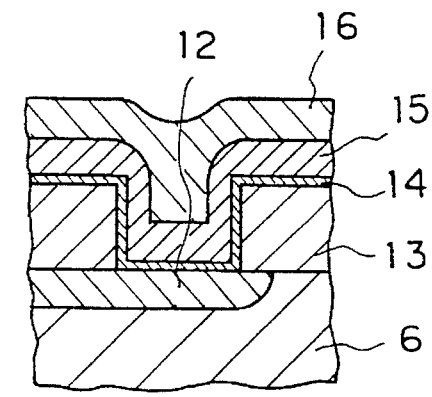
Figure 13:
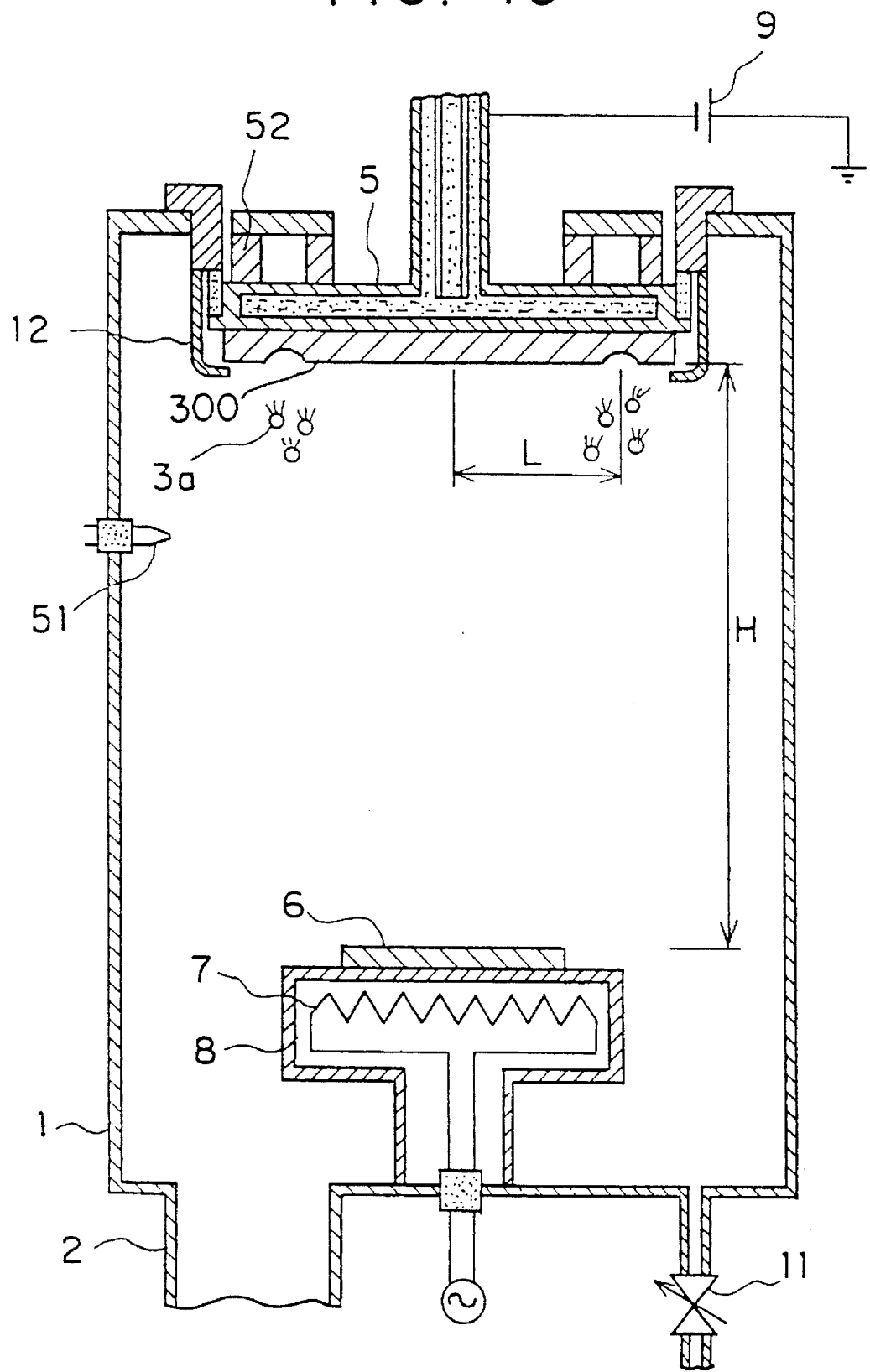
FIG. 13 is a sectional view showing an essential part of a typical thin film deposition apparatus employing a sputtering method according to the embodiment 16 of the present invention.

FIG. 13 is a sectional view showing an essential part of a typical thin film deposition apparatus employing a sputtering method according to embodiment 16 of the present invention. In FIG. 13, the same reference numerals are used for component parts which are identical to those of the conventional thin film deposition apparatus shown in FIG. 1, and descriptions thereof are omitted. In FIG. 13, reference numeral 51 indicates a trigger electron discharging electrode provided to facilitate a discharging start in low voltage, and 52 indicates a magnet to locally apply a magnetic field so as to sputter a source material 300 in an annular fashion.

In the thin film deposition apparatus constructed as set forth above, an annular sputtering area having a radius of L is provided by adjusting a position of the magnet 52 disposed on a back surface of the source material 300. A relation between a distance H between the source material 300 and a substrate 6, and the radius L of the sputtering area is set in a range as expressed by the expression (7) in the above embodiment 8. For example, when a titanium nitride thin film was deposited, a mixed gas of argon and nitrogen was introduced into a vacuum tank 1, and the source material 300 was thereafter sputtered. Consequently, it was possible to deposit a titanium nitride diffusion barrier thin film onto a bottom surface and a side surface of a contact hole with good coverage.

Embodiment 17

Alternatively, double annular sputtering areas were provided by varying an arrangement of a magnet 52 disposed on a back surface of a source material 300, and a relation between respective radii $L_1$ and $L_2$ of the respective sputtering areas was set in a range expressed by the expression (9) in the embodiment 10 so as to sputter the source material 300. In this case, it is also possible to deposit a diffusion barrier thin film onto a bottom surface and a side surface of a contact hole with good coverage.

Embodiment 18

The respective embodiments 16 and 17 have been described with reference to a disk-shaped source material 300. However, the present invention may employ a method of sputtering a side surface of a ring-shaped material or a cylindrical evaporation material in order to improve availability of the evaporation material, and to provide excellent film coverage.

Embodiment 19

Further, when the present invention is applied to, for example, a substrate 6 having a diameter of 200 mm, a source material having a small diameter of 20 mm or less may be employed and sputtered to serve as a source material particle beam generating source. The generating source can serve as a small surface and point source so that the generating source can be employed instead of a cluster ion beam source in the configuration illustrated in the above embodiments so as to deposit a thin film onto a bottom surface and a side surface of a contact hole with good coverage.

Embodiment 20

Figure 14:
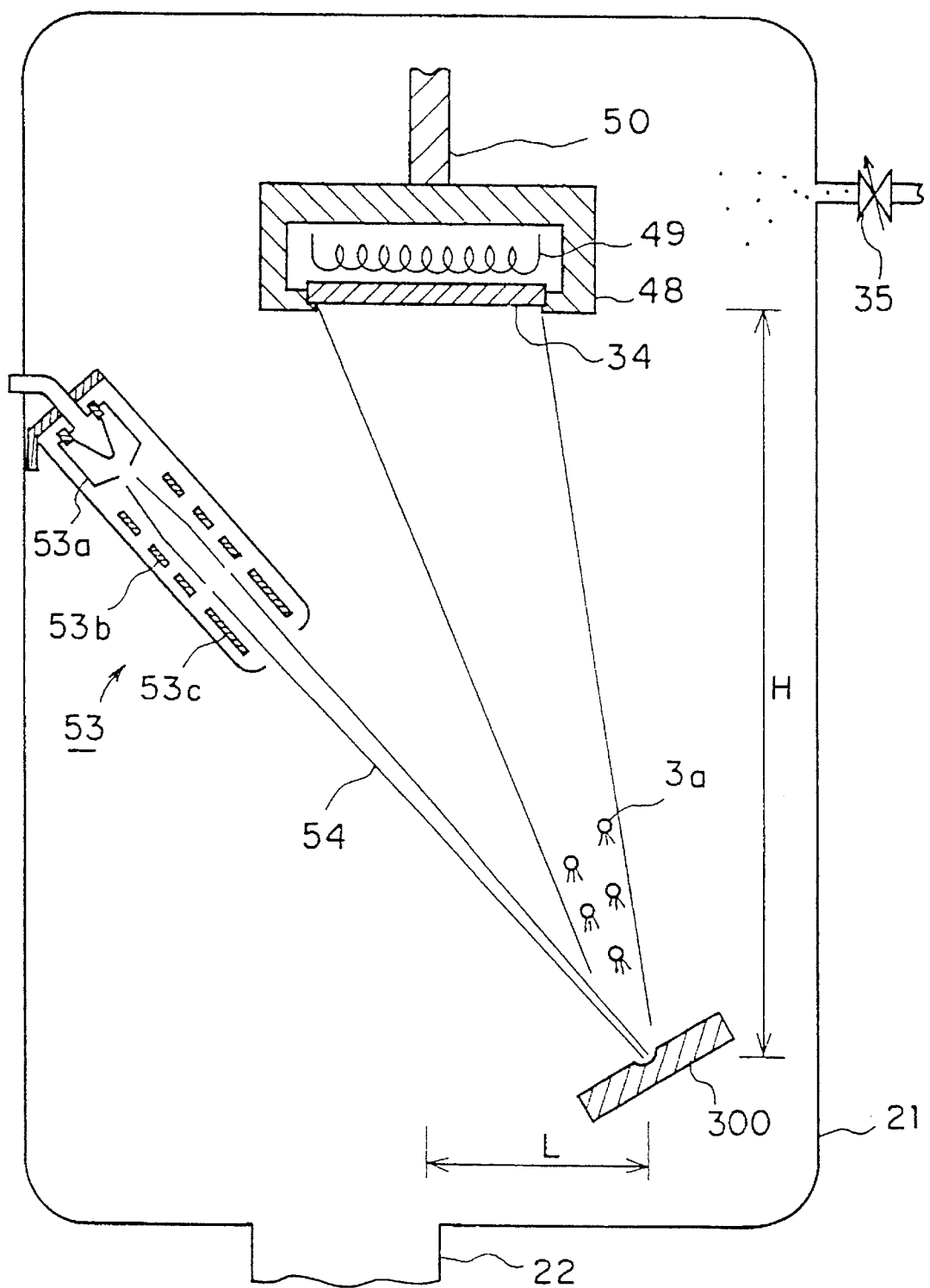
FIG. 14 is a sectional view showing an essential part of a typical thin film deposition apparatus employing an ion beam sputtering method according to embodiment 20 of the present invention.

FIG. 14 is a sectional view showing an essential part of a typical thin film deposition apparatus employing a sputtering method according to embodiment 20 of the present invention. In FIG. 14, the same reference numerals are used for component parts which are identical to those of the thin film deposition apparatus in the above embodiments, and descriptions thereof are omitted. In FIG. 14, reference numeral 53 means an ion source including an ion generating portion 53a, a focusing electrode 53b, and a deflecting electrode 53c, and the ion source 53 generates an ion beam 54 such as argon so as to sputter a source material 300.

When a substrate 34 has a diameter of 200 mm, a sputtering area of the source material 300, which is sputtered by the ion beam 54 ejected from the ion source 53, can serve as a small surface and point source in a limited range of 20 mm or less. Therefore, if each component part is disposed at the same position as that in the respective embodiments 1 and 8, it is possible to deposit a diffusion barrier thin film onto a bottom surface and a side surface of a contact hole with good coverage as in the respective embodiments.

Embodiment 21

Further, an ion beam 54 ejected from an ion source 53 in embodiment 20 may be deflected to provide a plurality of sputtering areas on a source material 300 so as to provide the same effect as that in embodiment 10.

Embodiment 22

Alternatively, an evaporation material 3 may be annularly irradiated with an ion beam 54 ejected from an ion source 53 in embodiment 20 so as to provide the same effect as that achieved when a ring-shaped source is employed.

Embodiment 23

Though the respective embodiments have been illustrated with reference to a case where a contact hole has a horizontal section in a circular form, it must noted that the present invention may be similarly applied to another contact hole having a horizontal section in an elliptical or oval form. For a circular section, the maximum aspect ratio is found by using the minimum radius d and a depth h. For an elliptical or oval section, an elliptical type or oval type evaporation source may be employed instead of the ring-shaped source illustrated in embodiment 15 since good coverage is ensured when there is an elliptical or oval locus of a center of an upper portion of the contact hole in a bottom surface of the contact hole.

Alternatively, the present invention may be applied to a pore other than the contact hole, such as a throughhole, an electrode hole, or an interconnecting hole. Further, the present invention may be applied to a fine groove (a trench). For the trench, the maximum aspect ratio is found by using a trench width w, and a depth h.

As set forth above, according to the first aspect of the present invention, the evaporation is performed by rotating the substrate, and causing the vapor beam of the evaporation material to be diagonally incident on the substrate.

According to the second aspect of the present invention, the evaporation is performed by disposing the evaporation sources immediately under the substrate, and setting them such that an incident angle of the vapor beam of the evaporation material on the substrate is not more than a cone angle of a side surface of a fine groove or pore.

According to the third aspect of the present invention, when the maximum aspect ratio is defined as AR=h/du a ratio of a depth h of a fine groove or a pore to a width du of the fine groove or a diameter du of the pore) the eccentric distance $L_1$ from the center axis of the substrate to the small surface or point source is set to approximately H/(2×AR) when the small surface or point source is employed as the evaporation source, or the radius $L_2$ of the ring-shaped source is set to approximately H/(2×AR) when the ring-shaped source is employed as the evaporation. and The evaporation is performed while the substrate is rotated when of the small surface or point source is used.

According to the fourth aspect of the present invention, the evaporation is performed by, when two small surface and point sources having a common distance H to the substrate are employed as the evaporation sources, rotating the substrate and setting the respective eccentric distances $L_{1a}$ and $L_{1b}$ from the center axis of the substrate to the respective small surface and point sources as follows:

$$R-H/(2\times AR) \leq L_{1a} \leq H/(2\times AR) \leq L_{1b} \leq H/(2\times AR)+L_{1a}$$

where R is a radius of the substrate. Alternatively, the evaporation is performed by, when two ring-shaped sources having the common distance H are employed as the evaporation sources, setting the respective radii $L_{2a}$ and $L_{2b}$ of the respective ring-shaped sources as follows:

$$R-H/(2\times AR) \leq L_{2a} \leq H/(2\times AR) \leq L_{2b} \leq H/(2\times AR)+L_{2a}$$

According to the fifth aspect of the present invention, the evaporation is performed by providing the sputtering area of the evaporation material with a diameter which is substantially one-tenth or less than a diameter of the substrate, disposing the evaporation material such that the sputtering area is positioned immediately under the substrate, and setting the evaporation material such that the incident angle of evaporation material particle on the substrate is not more than the cone angle of the side surface of the fine groove or the pore.

According to the sixth aspect of the present invention, when the maximum aspect ratio is defined as AR=h/du ratio of a depth h of the fine groove or pore to a width du of the fine groove or a diameter du of the pore), the evaporation is performed by sputtering the evaporation material in an annular fashion, and setting a radius $L_3$ of the annular sputtering area to approximately $H/(2 \times AR)$.

According to the seventh aspect of the invention, the evaporation is performed by, in case the sputtering areas of the evaporation material are set at two positions having a common distance H to the substrate, setting respective radii $L_{1a}$ and $L_{1b}$ of the respective sputtering areas of the evaporation material as follows:

$$R - H/(2 \times AR) \leq L_{1a} \leq H/(2 \times AR) \leq L_{1b} \leq H/(2 \times AR) + L_{1a}$$

where R is the radius of the substrate.

According to the eighth aspect of the present invention, the evaporation is performed by introducing the reactive gas, having a molecular weight lower than the mass of an evaporation material particle in the vapor beam of the evaporation material, into vacuum atmosphere.

According to the ninth aspect of the present invention, the evaporation is performed by introducing the inactive gas having a molecular weight lower than the mass of an evaporation material particle in the vapor beam of the evaporation material, into vacuum atmosphere.

According to the tenth aspect of the present invention, the evaporation is performed by introducing the mixed gas of the reactive gas, and the inactive gas having a molecular weight lower than the mass of an evaporation material particle in the vapor beam of the evaporation material, into vacuum atmosphere.

According to the eleventh aspect of the present invention, the evaporation is performed by introducing the respective gases in the eighth to tenth aspect such that the Knudsen number $K_n = \lambda/H$ (a ratio of a mean free path ($\lambda$) of the evaporation material particle in the vapor beam to a distance H between the evaporation sources and the substrate) is in an approximate range of 0.1 to 1.

According to the twelfth aspect of the present invention, the evaporation is performed by introducing a gas into the vacuum atmosphere, and setting pressure of the gas in the vicinity of a surface of the substrate such that the Knudsen number $K_n = \lambda/U$ (a ratio of the mean free path $\lambda$ of the evaporation material particle in the vapor beam under the pressure to a vertical length U of an area whose pressure is increased by introduction of the gas is in an approximate range of 0.1 to 1.

According to the thirteenth aspect of the present invention, the evaporation is performed by introducing a gas into the vacuum atmosphere, and holding pressure of the gas for a predetermined time period such that the Knudsen number $K_n = \lambda/H$ (a ratio of the mean free path $\lambda$ of the evaporation material particle in the vapor beam to the distance H between the evaporation sources and the substrate) becomes approximately 1, and increasing the pressure of the gas after the elapse of the predetermined time period such that the Knudsen number $K_n$ becomes approximately 0.1.

As a result, it is possible to provide a thin film deposition apparatus which can deposit a thin film having good coverage onto the bottom surface and the side surface of the fine groove or the pore which is provided in the substrate with a relatively high aspect ratio.

While preferred embodiments of the invention have been described using specific terms,-such description is for illustrative purposes only, and it is to be understood that changes and variations may be made without departing from the spirit or scope of the following claims.

What is claimed is:

1. A thin film deposition apparatus for depositing a thin film by irradiating a substrate having at least one recess with film material particles from a particle generator in a vacuum atmosphere, wherein said particle generator is disposed under said substrate and on a projection of a center axis of said substrate and is disposed according to a relationship:

$$R/H \leq \tan(\theta)$$

where a taper angle of the recess is defined as $\theta$, a radius of the substrate is defined as R and a distance between the substrate and an outlet of the particle generator is defined as H.

2. A thin film deposition apparatus according to claim 1, wherein the particle generator is a cluster ion beam source which generates cluster ions of film material.

3. A thin film deposition apparatus according to claim 1, wherein the particle generator is a sputter source from which metal atoms are sputtered, and a diameter of said particle generator is approximately one-tenth or less than a diameter of the substrate.

4. A thin film deposition apparatus for depositing a thin film by irradiating a substrate having at least one recess with film material particles from a particle generator in a vacuum atmosphere, comprising rotation means for rotating said substrate, wherein said particle generator is disposed at a distance L of approximately $H/(2 \times AR)$ from a projection of a center axis of said substrate, where the maximum aspect ratio is defined as AR=(h/du) found by a ratio of a depth h of said recess to a width or a diameter du of said recess, and a distance between the substrate and a plane where an outlet of the particle generator exists is defined as H.

5. A thin film deposition apparatus according to claim 4, wherein the particle generator is a cluster ion beam source which generates cluster ions of film material.

6. A thin film deposition apparatus according to claim 4, wherein the particle generator is defined as a spot sputtered area on a sputter source from which metal atoms are sputtered, and the apparatus comprises an ion source which irradiates said sputtered area with ions to sputter said sputter source.

7. A thin film deposition apparatus for depositing a thin film by irradiating a substrate having at least one recess with film material particles from a particle generator in a vacuum atmosphere, wherein said particle generator is a ring-shaped source having a center on an extension of a center axis of said substrate and a radius L of approximately $H/(2 \times AR)$, where the maximum aspect ratio is defined as AR=(h/du) found by a ratio of a depth h of said recess to a width or a diameter du of said recess, and a distance between the substrate and a plane where an outlet of the particle generator exists is defined as H.

8. A thin film deposition apparatus according to claim 7, wherein the particle generator is a cluster ion beam source which generates cluster ions of film material.

9. A thin film deposition apparatus according to claim 7, wherein the particle generator is defined as a ring-shaped sputtered area on a sputter source from which metal atoms are sputtered, and the apparatus comprises an ion collecting means for colliding ions with said sputtered area on said sputter source.

10. A thin film deposition apparatus for depositing a thin film by irradiating a substrate having at least one recess with film material particles from a particle generator in a vacuum atmosphere, comprising rotation means for rotating said substrate, wherein said particle generator comprises two generating sections disposed according to the following relationship:

$$R-H/(2\times AR) \leqq L1 \leqq H/(2\times AR) \leqq L2 \leqq H/(2\times R)+L1$$

where the maximum aspect ratio is defined as AR=(h/du) found by a ratio of a depth h of said recess to a width or a diameter du of said recess, a radius of the substrate is defined as R, a distance between the substrate and a plane where an outlet of the particle generator is defined as H, and respective distances between said generating sections and a projection of a center axis of said substrate are defined L1,L2 respectively.

11. A thin film deposition apparatus according to claim 10, wherein the generating sections are cluster ion beam sources which generate cluster ions of film material.

12. A thin film deposition apparatus for depositing a thin film by irradiating a substrate having at least one recess with film material particles from a particle generator in a vacuum atmosphere, wherein said particle generator comprises two ring-shaped generating sections centered on a projection of a center axis of said substrate, and wherein said generating sections are disposed such that respective radii L1,L2 of said generating sections meet a relationship:

$$R-H/(2\times R) \leqq L1 \leqq H/(2\times AR) \leqq L2 \leqq H/(2\times AR)+L1$$

where the maximum aspect ratio is defined as AR=(h/du) found by a ratio of a depth h of said recess to a width or a diameter du of said recess, a radius of the substrate is defined as R, and a distance between the substrate and a plane containing an outlet of the particle generator is defined as H.

13. A thin film deposition apparatus according to claim 12, wherein the generating sections are cluster ion beam sources which generate cluster ions of film material.

\* \* \* \* \*